(12) United States Patent
Bao et al.

(10) Patent No.: US 11,563,100 B2
(45) Date of Patent: Jan. 24, 2023

(54) THIN FILM TRANSISTOR AND METHOD FOR MANUFACTURING THE SAME, ARRAY SUBSTRATE, DISPLAY PANEL, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zheng Bao, Beijing (CN); Gong Chen, Beijing (CN); Yanxia Xin, Beijing (CN); Hongwei Hu, Beijing (CN); Yihao Wu, Beijing (CN); Yiyang Zhang, Beijing (CN); Guangzhou Zhao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/255,654

(22) PCT Filed: May 25, 2020

(86) PCT No.: PCT/CN2020/092094
§ 371 (c)(1),
(2) Date: Dec. 23, 2020

(87) PCT Pub. No.: WO2020/244404
PCT Pub. Date: Dec. 10, 2020

(65) Prior Publication Data
US 2021/0265478 A1 Aug. 26, 2021

(30) Foreign Application Priority Data
Jun. 4, 2019 (CN) .......................... 201910480914.5

(51) Int. Cl.
*H01L 29/45* (2006.01)
*H01L 21/285* (2006.01)
(Continued)

(52) U.S. Cl.
CPC ...... *H01L 29/458* (2013.01); *H01L 21/28518* (2013.01); *H01L 27/1222* (2013.01);
(Continued)

(58) Field of Classification Search
CPC ............. H01L 29/458; H01L 21/28518; H01L 27/1222; H01L 29/41733; H01L 29/66757;
(Continued)

(56) References Cited

U.S. PATENT DOCUMENTS 4,619,697 A * 10/1986 Hijikata ............ C04B 35/58085
204/291
5,053,917 A * 10/1991 Miyasaka ......... H01L 27/11502
361/321.5
(Continued)

FOREIGN PATENT DOCUMENTS

CN 101241937 A 8/2008
CN 101373792 A 2/2009
(Continued)

OTHER PUBLICATIONS

Tanielian, M. et al., "Physical Properties of Sputter-Deposited Titanium Silicide as a Function of Substrate Temperature", J. Electrochem. Soc.: Solid-State Science and Technology, Jun. 30, 1985, vol. 132 No. 6, pp. 1487-1491; Cited in CN Office Action dated Jul. 31, 2019. (5 pages).
(Continued)

*Primary Examiner* — Mohammed R Alam
(74) *Attorney, Agent, or Firm* — Whda, LLP

(57) ABSTRACT

Embodiments of the present disclosure provide a thin film transistor, a method for manufacturing a thin film transistor,
(Continued)

an array substrate, a display panel, and a display device. The thin film transistor includes: a base substrate; an active layer, an insulating layer, and a source-drain layer sequentially stacked on the base substrate, wherein the source-drain layer is electrically connected to the active layer through a via hole penetrating the insulating layer; and a transition layer arranged between the source-drain layer and the active layer at a position of the via hole, wherein the transition layer covers a bottom of the via hole and covers at least part of a sidewall of the via hole, and the transition layer comprises elements of the active layer and elements of a part of the source-drain layer, the part of the source-drain layer being in contact with the transition layer.

17 Claims, 5 Drawing Sheets

(51) Int. Cl.
*H01L 27/12* (2006.01)
*H01L 29/417* (2006.01)
*H01L 29/66* (2006.01)
*H01L 29/786* (2006.01)
*H01L 27/32* (2006.01)
*H01L 51/00* (2006.01)

(52) U.S. Cl.
CPC .. *H01L 29/41733* (2013.01); *H01L 29/66757* (2013.01); *H01L 29/78675* (2013.01); *H01L 27/3262* (2013.01); *H01L 51/0097* (2013.01); *H01L 2251/5338* (2013.01)

(58) Field of Classification Search
CPC ........... H01L 29/78675; H01L 27/3262; H01L 51/0097; H01L 2251/5338; H01L 29/78618
See application file for complete search history.

(56) References Cited

U.S. PATENT DOCUMENTS

| | | | |
|---|---|---|---|
| 7,833,846 B1 | 11/2010 | Choi et al. | |
| 8,304,819 B2 | 11/2012 | Jung | |
| 8,513,669 B2 | 8/2013 | Park et al. | |
| 8,890,163 B2 | 11/2014 | Jung | |
| 9,245,967 B2 | 1/2016 | Jung | |
| 9,368,637 B2 | 6/2016 | Zhang et al. | |
| 9,768,308 B2 | 9/2017 | Lu et al. | |
| 10,658,516 B2 | 5/2020 | Han et al. | |
| 2003/0141553 A1 | 7/2003 | Miura | |
| 2008/0012022 A1 | 1/2008 | Moriwaki | |
| 2009/0050894 A1 | 2/2009 | Park et al. | |
| 2011/0084320 A1 | 4/2011 | Jung | |
| 2013/0001576 A1 | 1/2013 | Jung | |
| 2014/0103351 A1 | 4/2014 | Liu et al. | |
| 2015/0035057 A1 | 2/2015 | Jung | |
| 2015/0214373 A1 | 7/2015 | Zhang et al. | |
| 2016/0254389 A1 | 9/2016 | Lu et al. | |
| 2017/0345943 A1 | 11/2017 | Han et al. | |
| 2018/0166584 A9 | 6/2018 | Han et al. | |
| 2019/0181210 A1* | 6/2019 | Baek | H01L 27/3244 |

FOREIGN PATENT DOCUMENTS

| | | |
|---|---|---|
| CN | 102044424 A | 5/2011 |
| CN | 102646715 A | 8/2012 |
| CN | 103219391 A | 7/2013 |
| CN | 104300006 A | 1/2015 |
| CN | 104409346 A | 3/2015 |
| CN | 104882488 A | 9/2015 |
| CN | 109037343 A | 12/2018 |
| CN | 109920819 A | 6/2019 |
| CN | 110010701 A | 7/2019 |
| TW | 201415639 A | 4/2014 |

OTHER PUBLICATIONS

Koster, H. et al., "Comparison of the Properties of TiSi 2 Films Obtained by Silicon and Titanium Co-Sputtering and by Composite Target Sputtering", Thin Solid Films; Mar. 1, 1989, vol. 170, pp. 1-13; Cited in CN Office Action dated Jul. 31, 2019. (10 pages).
Office Action dated Jul. 31, 2019, issued in counterpart CN Application No. 201910480914.5, with English Translation. (22 pages).
English Translation of International Search Report dated Aug. 17, 2020, issued in counterpart Application No. PCT/CN2020/092094. (3 pages).
Written Opinion dated Aug. 17, 2020, issued in counterpart Application No. PCT/CN2020/092094. (4 pages).

\* cited by examiner

THIN FILM TRANSISTOR AND METHOD FOR MANUFACTURING THE SAME, ARRAY SUBSTRATE, DISPLAY PANEL, AND DISPLAY DEVICE

CROSS-REFERENCE TO RELATED APPLICATION

This application claims priority to the Chinese Patent Application No. 201910480914.5, filed with China National Intellectual Property Administration, on Jun. 4, 2019, which is incorporated herein by reference in its entirety.

TECHNICAL FIELD

The embodiments of present disclosure relates to a field of semiconductor technology, and in particular to a thin film transistor, a method for manufacturing a thin film transistor, an array substrate, a display panel, and a display device.

BACKGROUND

Flat panel displays (FPDs) include liquid crystal displays (LCDs), organic light-emitting diode (OLED) displays, plasma displays, and field emission displays (FEDs).

SUMMARY

An embodiment of the present disclosure provides a thin film transistor, comprising: a base substrate; an active layer, an insulating layer, and a source-drain layer sequentially stacked on the base substrate, wherein the source-drain layer is electrically connected to the active layer through a via hole penetrating the insulating layer; and a transition layer arranged between the source-drain layer and the active layer at a position of the via hole, wherein the transition layer covers a bottom of the via hole and covers at least part of a sidewall of the via hole, and the transition layer comprises elements of the active layer and elements of a part of the source-drain layer, the part of the source-drain layer being in contact with the transition layer.

In a possible implementation manner, the source-drain layer comprises a plurality of film layers, and the part of the source-drain layer in contact with the transition layer is one of the plurality of film layers of the source-drain layer, the one being in contact with the transition layer.

In a possible implementation manner, the transition layer covers the whole sidewall of the via hole.

In a possible implementation manner, the transition layer further covers an edge area of the insulating layer at the position of the via hole.

In a possible implementation manner, an orthographic projection of the transition layer on the base substrate is covered by an orthographic projection of the source-drain layer on the base substrate.

In a possible implementation manner, a material of the active layer is polysilicon, a material of one of the plurality of film layers of the source-drain layer in contact with the transition layer is titanium, and a material of the transition layer is titanium disilicide.

In a possible implementation manner, the source-drain layer has a stacked structure formed by stacking a titanium layer, an aluminum layer, and a titanium layer.

In a possible implementation manner, the insulating layer comprises a first insulating layer and a second insulating layer located on a side of the first insulating layer away from the active layer, and a gate is further provided between the first insulating layer and the second insulating layer.

In a possible implementation manner, the insulating layer further comprises an interlayer dielectric layer located on a side of the second insulating layer away from the gate.

In a possible implementation manner, the transition layer is an integrated structure.

An embodiment of the present disclosure further provides an array substrate comprising the thin film transistor according to an embodiment of the present disclosure.

An embodiment of the present disclosure further provides a display panel comprising the array substrate according to an embodiment of the present disclosure.

An embodiment of the present disclosure further provides a display device comprising the display panel according to an embodiment of the present disclosure.

An embodiment of the present disclosure further provides a method for manufacturing a thin film transistor, comprising: providing a base substrate; forming an active layer on a side of the base substrate; forming an insulating layer on a side of the active layer away from the base substrate; forming a via hole exposing the active layer in the insulating layer; forming a transition layer at a position of the via hole, wherein the transition layer covers a bottom of the via hole and covers at least part of a sidewall of the via hole; and forming a source-drain layer on a side of the transition layer away from the active layer, wherein the transition layer comprises elements of the active layer and elements of a part of the source-drain layer, the part of the source-drain layer being in contact with the transition layer.

In a possible implementation manner, the source-drain layer comprises a plurality of film layers, and the part of the source-drain layer in contact with the transition layer is one of the plurality of film layers of the source-drain layer, the one being in contact with the transition layer.

In a possible implementation manner, before forming a transition layer at a position of the via hole, the method further comprises: uniformly mixing titanium and silicon in a preset atomic ratio, and calcining at a preset temperature to form titanium disilicide; and the forming a transition layer at a position of the via hole comprises: using the titanium disilicide as a target material, and forming a titanium disilicide transition layer at the position of the via hole by using a magnetron sputtering process through a mask.

In a possible implementation manner, the calcining at a preset temperature to form titanium disilicide comprises: calcining at 1300° C. to 1500° C. to form a titanium disilicide mixture.

In a possible implementation manner, a material of the active layer is polysilicon, a material of one of the plurality of film layers of the source-drain layer in contact with the transition layer is titanium, and a material of the transition layer is titanium disilicide.

In a possible implementation manner, the source-drain layer has a stacked structure formed by stacking a titanium layer, an aluminum layer, and a titanium layer.

In a possible implementation manner, the transition layer covers the whole sidewall of the via hole.

DETAILED DESCRIPTION OF EMBODIMENTS

Figure 1:
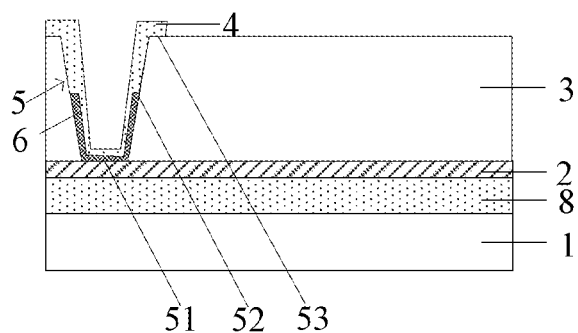
FIG. 1 is a schematic structural diagram of a thin film transistor provided by an embodiment of the present disclosure.

The embodiments of the present disclosure will be described in detail below in conjunction with the drawings of the specification. It should be noted that the same or similar reference numerals indicate the same or similar elements or elements with the same or similar functions. The embodiments described below with reference to the accompanying drawings are exemplary, and are only used to explain the present disclosure, and cannot be understood as a limitation to the present disclosure.

The inventor found that with continuous improvement of resolution, a signal line width and a via hole size of a display panel may continue to decrease, which may cause a contact resistance between an active layer and a source-drain layer to further increase, and finally problems of a serious RC delay and a greater power consumption will occur.

With reference to FIG. 1, an embodiment of the present disclosure provides a thin film transistor, including: a base substrate 1; an active layer 2, an insulating layer 3, and a source-drain layer 4 stacked on the base substrate 1 in sequence, wherein the source-drain layer 4 is electrically connected to the active layer 2 through a via hole 5 penetrating the insulating layer 3; and a transition layer 6 arranged between the source-drain layer 4 and the active layer 2 at a position of the via hole 5, the transition layer 6 covers a bottom 51 of the via hole 5 and at least part of a sidewall 52 of the via hole 5. The transition layer 6 includes elements of the active layer 2 and elements of a part of the source-drain layer 4, the part being in contact with the transition layer 6.

Figure 4:
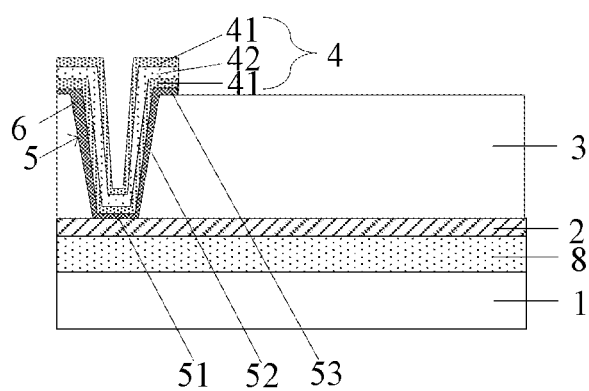
FIG. 4 is a schematic structural diagram of a thin film transistor with a source-drain layer being a stacked structure formed by stacking a Ti layer, an Al layer, and a Ti layer provided by an embodiment of the present disclosure.
Figure 5:
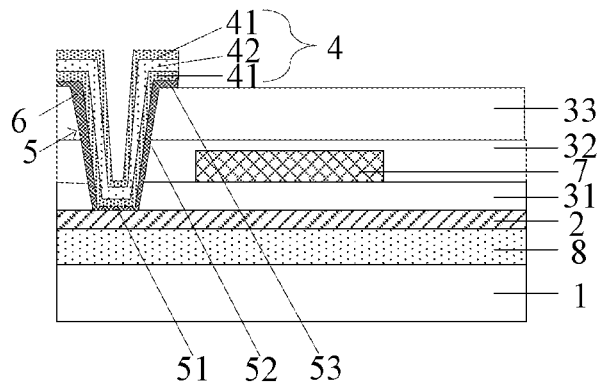
FIG. 5 is a schematic structural diagram of a specific thin film transistor provided by an embodiment of the present disclosure.

According to an embodiment of the present disclosure, a resistance of the transition layer 6 is between a resistance of the active layer 2 and a resistance of the part of the source-drain layer 4 in contact with the transition layer 6. With reference to FIGS. 4 and 5, the source-drain layer 4 includes a plurality of film layers, and the part of the source-drain layer 4 in contact with the transition layer 6 is a film layer 41, which is in contact with the transition layer 6, in the plurality of film layers of the source-drain layer 4. The resistance of the transition layer 6 is between the resistance of the active layer 2 and the resistance of the film layer. The transition layer 6 may be an integrated structure. The bottom 51 of the via hole 5 is constituted by a part of the surface of the active layer 2 exposed by the via hole 5.

The thin film transistor provided by an embodiment of the present disclosure includes: an active layer 2, an insulating layer 3, and a source-drain layer 4 stacked on a base substrate 1 in sequence, wherein the source-drain layer 4 is electrically connected to the active layer 2 through a via hole 5 penetrating the insulating layer 3; and a transition layer 6 arranged between the source-drain layer 4 and the active layer 2 at a position of the via hole 5, the transition layer 6 covers a bottom 51 of the via hole 5 and at least part of a sidewall 52 of the via hole 5, the transition layer 6 is an integrated structure. The transition layer 6 includes elements of the active layer 2 and elements of a film layer, wherein the film layer is a film layer of the source-drain layer 4 in contact with the transition layer 6. That is, in the embodiment of the present disclosure, the transition layer 6 is formed between the source-drain layer 4 and the active layer 2 at the position of the via hole 5, and the transition layer 6 includes the elements of the active layer 2 and the elements of the film layer, in this way, when the active layer 2 and the source-drain layer 4 are electrically connected through the via hole 5, a contact resistance at the position of the via hole 5 may be reduced. In addition, when the size of the via hole 5 gradually becomes smaller, the transition layer 6 not only covers the bottom 51 of the via hole 5, but also covers at least part of the sidewall 52, which may enhance an electrical connection performance between the source-drain layer 4 and the active layer 2 at the position of the via hole 5.

In specific implementation, the thin film transistor in an embodiment of the present disclosure may be a thin film transistor in an OLED display panel, and the base substrate 1 may specifically be a flexible organic base substrate. A buffer layer 8 may also be provided between the base substrate 1 and the active layer 2.

Figure 2:
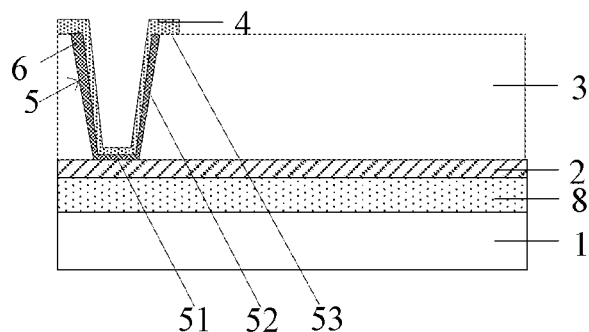
FIG. 2 is a schematic structural diagram of a thin film transistor with a transition layer covering whole sidewall of a via hole provided by an embodiment of the disclosure.

In a specific implementation, referring to FIG. 2, the transition layer 6 covers the whole sidewall 52 of the via hole 5.

Figure 3:
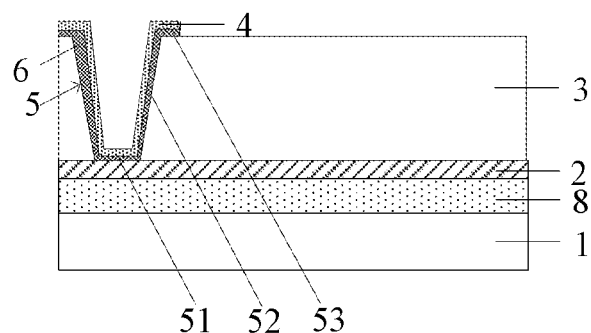
FIG. 3 is a schematic structural diagram of a thin film transistor with a transition layer further covering a part of an area on a gate layer provided by an embodiment of the present disclosure.

In a specific implementation, referring to FIG. 3, the transition layer 6 also covers an edge area 53 of the insulating layer 3 at the position of the via hole 5, that is, an area, close to the via hole 5, of a side of the insulating layer 3 away from the active layer 2 shown in FIG. 3. An orthographic projection of the transition layer 6 on the base substrate 1 is covered by an orthographic projection of the source-drain layer 4 on the base substrate 1.

In a specific implementation, referring to FIGS. 4 and 5, a material of the active layer 2 may specifically be polysilicon. A material of the film layer 41, in contact with the transition layer 6, in the plurality of film layers of the source-drain layer 4 may specifically be titanium, and a material of the transition layer 6 is titanium disilicide. In an embodiment of the present disclosure, the material of the transition layer 6 is titanium disilicide $TiSi_2$, which has a face-centered orthorhombic crystal structure and belongs to C54 phase. Compared with dititanium silicide $Ti_2Si$ (body-centered orthorhombic crystal structure, which belongs to C49 phase and is a high-resistance metal oxide, and it is no longer suitable for a high-resolution display panel that needs to reduce low resistance of the active layer and the source-drain layer at the position of the via hole), the titanium disilicide $TiSi_2$ in an embodiment of the present disclosure is a low-resistance metal oxide, which may meet the needs of a high-resolution display panel to reduce the low resistance of the active layer and the source-drain layer at the position of the via hole. However, as the titanium disilicide $TiSi_2$ in an embodiment of the present disclosure is formed from two adjacent film layers in a annealing process, a required temperature is relatively high (≥750° C.), and it may not be formed during a low-temperature annealing process of the source-drain layer (the annealing temperature of the source-drain layer is low, around 230° C.). When the thin film transistor in an embodiment of the present disclosure is a thin film transistor of an OLED display panel, since the organic OLED display panel involves more organic film layers, the high temperature may damage the organic film layers. Therefore, the transition layer in an embodiment of the present disclosure may be formed in an independent process, that is, formed by a magnetron sputtering process through a mask.

In a specific implementation, referring to FIG. 4, the source-drain layer 4 is a stacked structure formed by stacking a titanium layer, an aluminum layer, and a titanium layer. The stacked structure formed by stacking the titanium layer, the aluminum layer, and the titanium layer may specifically include a titanium film layer 41, an aluminum film layer 42, and the titanium film layer 41.

In specific implementation, referring to FIG. 5, the insulating layer 3 may specifically include a first insulating layer 31 and a second insulating layer 32 located on a side of the first insulating layer 31 away from the active layer 2. There is also a gate 7 between the first insulating layer 31 and the second insulating layer 32.

In a specific implementation, referring to FIG. 5, the insulating layer 3 further includes an interlayer dielectric layer 33 on a side of the second insulating layer 32 away from the gate 7.

Based on same inventive concept, an embodiment of the present disclosure further provides an array substrate including the thin film transistor provided by an embodiment of the present disclosure.

Based on same inventive concept, an embodiment of the present disclosure further provides a display panel including the array substrate provided by an embodiment of the present disclosure.

Based on same inventive concept, an embodiment of the present disclosure further provides a display device including the display panel provided by an embodiment of the present disclosure.

Figure 6:
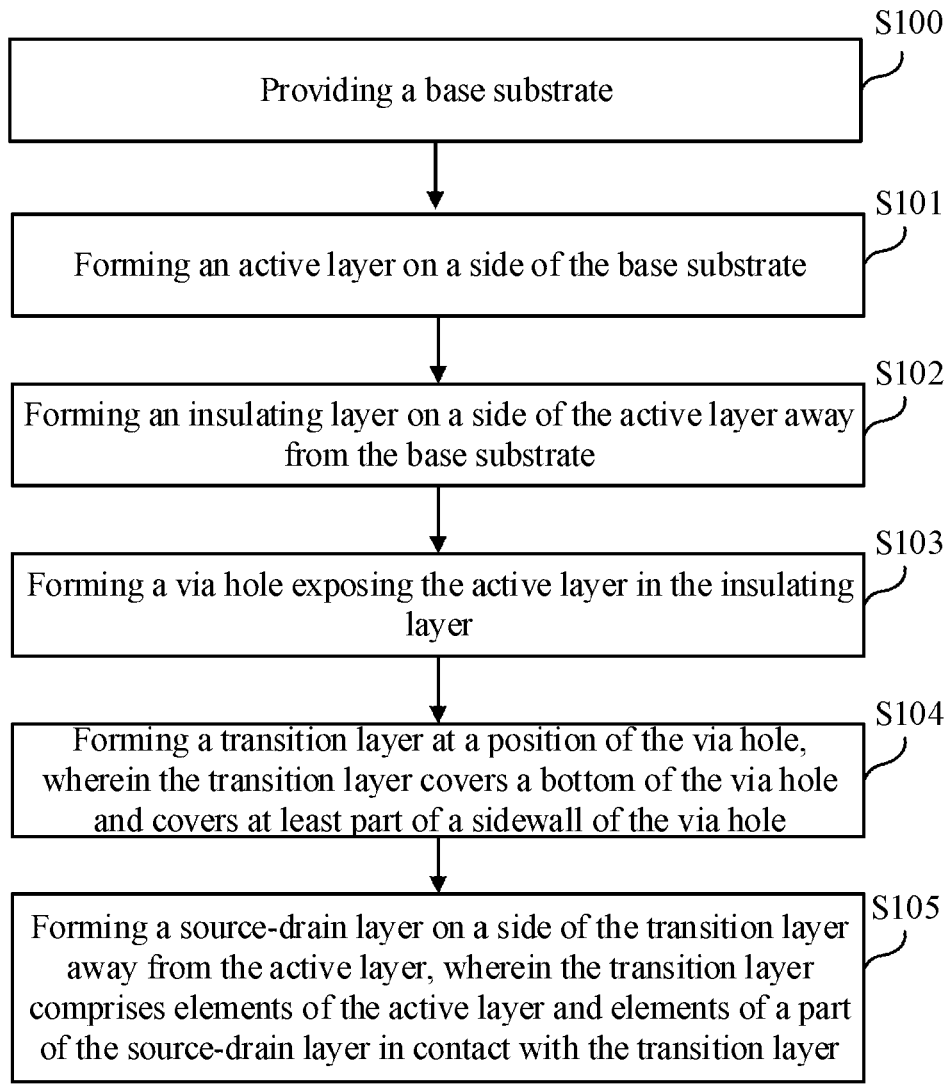
FIG. 6 is a schematic structural diagram of a process for manufacturing a thin film transistor provided by an embodiment of the present disclosure.

Based on same inventive concept, referring to FIG. 6, an embodiment of the present disclosure further provides a method for manufacturing the thin film transistor, including: step S100, providing a base substrate; step S101, forming an active layer on a side of the base substrate; step S102, forming an insulating layer on a side of the active layer away from the base substrate; step S103, forming a via hole exposing the active layer in the insulating layer; step S104, forming a transition layer at a position of the via hole, the transition layer covering a bottom of the via hole and at least part of a sidewall of the via hole; step S105, forming a source-drain layer on a side of the transition layer away from the active layer, the transition layer including elements of the active layer and elements of a part of the source-drain layer in contact with the transition layer.

According to an embodiment of the present disclosure, referring to FIGS. 4 and 5, the source-drain layer 4 includes a plurality of film layers, and the part of the source-drain layer 4 in contact with the transition layer 6 is a film layer 41, in contact with the transition layer 6, of the plurality of film layers of the source-drain layer 4.

The method for manufacturing the thin film transistor provided by an embodiment of the present disclosure may be specifically used to manufacture the thin film transistor provided by an embodiment of the present disclosure.

In a specific implementation, before forming a transition layer at a position of the via hole, the method for manufacturing the embodiment of the present disclosure further includes that: uniformly mixing titanium and silicon in a preset atomic ratio and calcining the mixture at a preset temperature to form titanium disilicide. Accordingly, for step S104, forming a transition layer at a position of the via hole may specifically include: using titanium disilicide as a target material, and forming a titanium disilicide transition layer at the position of the via hole by using a magnetron sputtering process through a mask. In an embodiment of the present disclosure, when producing the transition layer, a titanium disilicide target may be formed by calcination at a high temperature first, and then in a later production of the transition layer, the titanium disilicide may be directly used as the target material and the transition layer may be formed by the magnetron sputtering process, which avoids a problem that when the thin film transistor in an embodiment of the present disclosure is a thin film transistor of an OLED display panel, the organic film layers of the OLED display panel may be damaged because the OLED display panel may not withstand the temperature of producing the titanium disilicide transition layer.

In a specific implementation, calcining at a preset temperature to form titanium disilicide may specifically include: calcining at 1300° C. to 1500° C. to form a titanium disilicide mixture.

Hereinafter, a process for manufacturing the thin film transistor in the embodiment of the present disclosure may be further illustrated with reference to FIGS. 7 to 11.

Figure 7:
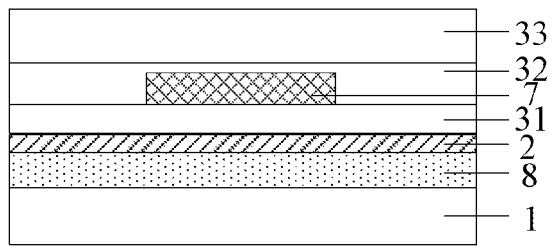
FIG. 7 is a schematic structural diagram of a thin film transistor after forming an interlayer dielectric layer in an embodiment of the present disclosure.

Step 1: a buffer layer 8, an active layer 2, a first gate insulating layer 31, a gate 7, a second gate insulating layer 32, and an interlayer dielectric layer 33 are sequentially formed on the base substrate 1. A material of the base substrate 1 may specifically be polyimide (PI), and a material of the active layer 2 may specifically be polysilicon. A structure diagram of the thin film transistor after the interlayer dielectric layer 33 is formed is shown in FIG. 7.

Figure 8:
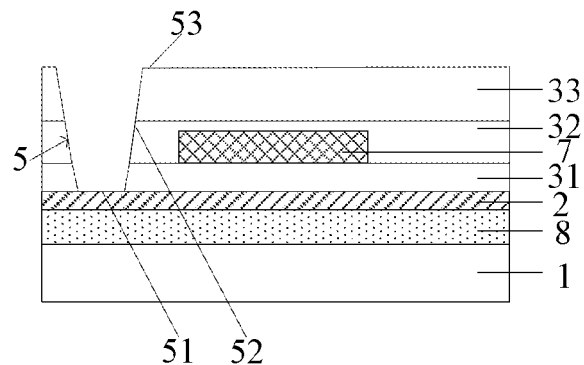
FIG. 8 is a schematic structural diagram of a thin film transistor after forming a via hole in an embodiment of the present disclosure.

Step 2: a hole in the insulating layer 3 is punched to form a via hole 5 exposing the active layer 2. A structure diagram of the thin film transistor after the via hole 5 is formed is shown in FIG. 8.

Figure 9:
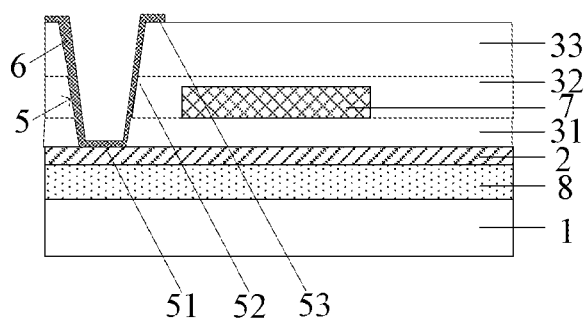
FIG. 9 is a schematic structural diagram of a thin film transistor after forming a transition layer in an embodiment of the present disclosure.

Step 3: titanium disilicide is used as a target material, and a transition layer 6 is formed at a position of the via hole 5 by a magnetron sputtering process through a mask. The transition layer 6 covers a bottom of the via hole 5 and a sidewall of the via hole 5, and also covers an edge area 53 of the insulating layer 3 (specifically, the interlayer dielectric layer 33) at the position of the via hole 5, and an orthographic projection of the transition layer 6 on the base substrate 1 is covered by an orthographic projection of the source-drain layer 4 on the base substrate 1, that is, the transition layer 6 is only located in an area in which the via hole 5 is located and the edge area 53 thereof. A structure diagram of the thin film transistor after the transition layer 6 is formed is shown in FIG. 9.

Figure 10:
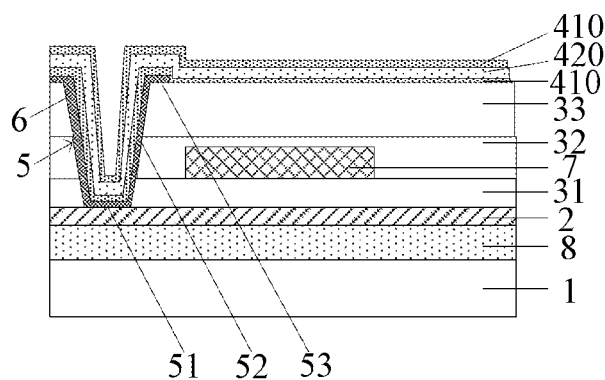
FIG. 10 is a schematic structural diagram of a thin film transistor after forming a thin film layer formed by stacking a Ti layer, an Al layer, and a Ti layer in an embodiment of the present disclosure.

Step 4: a titanium thin film layer 410, an aluminum thin film layer 420, and the titanium thin film layer 410 are sequentially formed by a sputtering process. A structure diagram of the thin film transistor after a thin film layer formed by stacking a Ti layer, an Al layer, and a Ti layer is formed is shown in FIG. 10.

Figure 11:
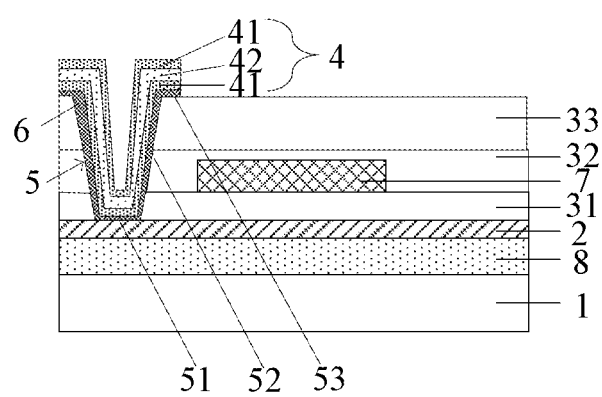
FIG. 11 is a schematic structural diagram of a thin film transistor after forming a source-drain layer in an embodiment of the present disclosure.

Step 5: the thin film layer formed by stacking the Ti layer, the Al layer, and the Ti layer is etched by a dry etching process (Dry Etch), a source and drain (SD) wiring structure is etched out. A structure diagram of the thin film transistor after the source-drain layer 4 formed by stacking the Ti layer, the Al layer, and the Ti layer is formed is shown in FIG. 11. Of course, the above drawings are only examples of forming a source or a drain on a side of the gate 7. In a specific implementation, the source may be provided on a side of the gate 7, and the drain may be provided on the other side of the gate 7, and the present disclosure is not limited to this.

The thin film transistor provided by an embodiment of the present disclosure includes: an active layer 2, an insulating layer 3, and a source-drain layer 4 stacked on a base substrate 1 in sequence, wherein the source-drain layer 4 is electrically connected to the active layer 2 through a via hole 5 penetrating the insulating layer 3; and a transition layer 6 arranged between the source-drain layer 4 and the active layer 2 at a position of the via hole 5, the transition layer 6 covers a bottom 51 of the via hole 5 and at least part of a sidewall 52 of the via hole 5, the at least part of the sidewall 52 being connected to the bottom. The transition layer 6 includes elements of the active layer 2 and elements of a film layer, wherein the film layer is a film layer of the source-drain layer 4 in contact with the transition layer 6, that is, in an embodiment of the present disclosure, the transition layer 6 is formed at a position of the via hole 5 and between the source-drain layer 4 and the active layer 2, and the transition layer 6 includes elements of the active layer 2 and elements of the film layer, so that when the active layer 2 and the source-drain layer 4 are electrically connected through the via hole 5, a contact resistance at the position of the via hole 5 may be reduced. In addition, when a size of the via hole 5 gradually becomes smaller, the transition layer 6 not only covers the bottom of the via hole 5, but also covers at least part of the sidewall, which may enhance an electrical connection performance between the source-drain layer 4 and the active layer 2 at the position of the via hole 5.

Obviously, those skilled in the art may make various modifications and variations to the present disclosure without departing from the spirit and scope of the present disclosure. In this way, if these modifications and variations of the present disclosure fall within the scope of the claims and their equivalent technologies of the present disclosure, the present disclosure is also intended to include these modifications and variations.

What is claimed is:

1. A thin film transistor, comprising:
   a base substrate;
   an active layer, an insulating layer, and a source-drain layer sequentially stacked on the base substrate, wherein the source-drain layer is electrically connected to the active layer through a via hole penetrating the insulating layer; and
   a transition layer arranged between the source-drain layer and the active layer and at a position of the via hole, wherein the transition layer comprises a first portion covering a bottom of the via hole, a second portion covering the whole sidewall of the via hole, a third portion located above the insulating layer and covered by the source-drain layer, and the transition layer comprises elements of the active layer and elements of a part of the source-drain layer, the part of the source-drain layer being in contact with the transition layer.

2. The thin film transistor according to claim 1, wherein:
   the source-drain layer comprises a plurality of film layers, and the part of the source-drain layer in contact with the transition layer is one of the plurality of film layers of the source-drain layer, the one being in contact with the transition layer.

3. The thin film transistor according to claim 1, wherein:
   an orthographic projection of the transition layer on the base substrate is covered by an orthographic projection of the source-drain layer on the base substrate.

4. The thin film transistor according to claim 2, wherein:
   a material of the active layer is polysilicon, a material of one of the plurality of film layers of the source-drain layer in contact with the transition layer is titanium, and a material of the transition layer is titanium disilicide.

5. The thin film transistor according to claim 4, wherein:
   the source-drain layer has a stacked structure formed by stacking a titanium layer, an aluminum layer, and a titanium layer.

6. The thin film transistor according to claim 1, wherein:
   the insulating layer comprises a first insulating layer and a second insulating layer located on a side of the first insulating layer away from the active layer, and a gate is further provided between the first insulating layer and the second insulating layer.

7. The thin film transistor according to claim 6, wherein:
   the insulating layer further comprises an interlayer dielectric layer located on a side of the second insulating layer away from the gate.

8. The thin film transistor according to claim 1, wherein:
   the transition layer is an integrated structure.

9. An array substrate comprising the thin film transistor according to claim 1.

10. A display panel comprising the array substrate according to claim 9.

11. A display device comprising the display panel according to claim 10.

12. A method for manufacturing a thin film transistor, comprising:
   providing a base substrate;
   forming an active layer on a side of the base substrate;
   forming an insulating layer on a side of the active layer away from the base substrate;
   forming a via hole exposing the active layer in the insulating layer;
   forming a transition layer at a position of the via hole, wherein the transition layer comprises a first portion covering a bottom of the via hole, a second portion covering the whole sidewall of the via hole, and a third portion located above the insulating layer; and
   forming a source-drain layer on a side of the transition layer away from the active layer, wherein the transition layer comprises elements of the active layer and elements of a part of the source-drain layer, the part of the source-drain layer being in contact with the transition layer;
   wherein the third portion is covered by the source-drain layer.

13. The method according to claim 12, wherein:
   the source-drain layer comprises a plurality of film layers, and the part of the source-drain layer in contact with the transition layer is one of the plurality of film layers of the source-drain layer, the one being in contact with the transition layer.

14. The method according to claim 12, wherein:
before forming a transition layer at a position of the via hole, the method further comprises: uniformly mixing titanium and silicon in a preset atomic ratio, and calcining at a preset temperature to form titanium disilicide; and
the forming a transition layer at a position of the via hole comprises: using the titanium disilicide as a target material, and forming a titanium disilicide transition layer at the position of the via hole by using a magnetron sputtering process through a mask.

15. The method according to claim 14, wherein:
the calcining at a preset temperature to form titanium disilicide comprises:
calcining at 1300° C. to 1500° C. to form a titanium disilicide mixture.

16. The method according to claim 13, wherein:
a material of the active layer is polysilicon, a material of one of the plurality of film layers of the source-drain layer in contact with the transition layer is titanium, and a material of the transition layer is titanium disilicide.

17. The method according to claim 16, wherein:
the source-drain layer has a stacked structure formed by stacking a titanium layer, an aluminum layer, and a titanium layer.

* * * * *